(12) United States Patent
Wada et al.

(10) Patent No.: US 11,056,501 B2
(45) Date of Patent: Jul. 6, 2021

(54) THREE-DIMENSIONAL NAND MEMORY DEVICE WITH SOURCE LINE COMPRISING METALLIC AND SEMICONDUCTOR LAYERS

(71) Applicant: TOSHIBA MEMORY CORPORATION, Tokyo (JP)

(72) Inventors: Hideo Wada, Yokkaichi Mie (JP); Hideto Takekida, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 542 days.

(21) Appl. No.: 15/905,302

(22) Filed: Feb. 26, 2018

(65) Prior Publication Data

US 2019/0081062 A1 Mar. 14, 2019

(30) Foreign Application Priority Data

Sep. 8, 2017 (JP) .............................. JP2017-173288

(51) Int. Cl.
| | | |
|---|---|---|
| *H01L 27/11582* | (2017.01) | |
| *H01L 29/10* | (2006.01) | |
| *H01L 27/11568* | (2017.01) | |
| *H01L 27/11573* | (2017.01) | |
| *H01L 23/528* | (2006.01) | |
| *H01L 27/11575* | (2017.01) | |
| *H01L 21/822* | (2006.01) | |
| *H01L 21/768* | (2006.01) | |
| *H01L 21/8234* | (2006.01) | |
| *H01L 27/1157* | (2017.01) | |
| *H01L 27/1158* | (2017.01) | |
| *H01L 27/112* | (2006.01) | |
| *H01L 27/06* | (2006.01) | |
| *H01L 23/522* | (2006.01) | |

(52) U.S. Cl.
CPC .. *H01L 27/11582* (2013.01); *H01L 21/76805* (2013.01); *H01L 21/76877* (2013.01); *H01L 21/8221* (2013.01); *H01L 21/823475* (2013.01); *H01L 23/528* (2013.01); *H01L 23/5283* (2013.01); *H01L 27/0688* (2013.01); *H01L 27/1128* (2013.01); *H01L 27/1157* (2013.01); *H01L 27/1158* (2013.01); *H01L 27/11568* (2013.01); *H01L 27/11573* (2013.01); *H01L 27/11575* (2013.01); *H01L 29/1037* (2013.01); *H01L 23/5226* (2013.01)

(58) Field of Classification Search
CPC ............. H01L 27/0688; H01L 27/1128; H01L 27/1157; H01L 27/11573; H01L 27/1158; H01L 27/11582
See application file for complete search history.

(56) References Cited

U.S. PATENT DOCUMENTS 8,344,385 B2 1/2013 Kim et al.
2017/0179152 A1* 6/2017 Toyama ............ H01L 27/11582

\* cited by examiner

*Primary Examiner* — Marcos D. Pizarro
(74) *Attorney, Agent, or Firm* — Kim & Stewart LLP

(57) ABSTRACT

According to an embodiment, a memory device comprises a conductive layer containing a metal, a semiconductor layer on the conductive layer, electrode layers stacked on the semiconductor layer in a stacking direction, a semiconductor pillar penetrating the electrode layers in the stacking direction and electrically connected to the semiconductor layer, and a charge trap layer between the electrode layers and the semiconductor pillar. The conductive layer has a recess or a through-hole below the semiconductor pillar.

16 Claims, 5 Drawing Sheets

THREE-DIMENSIONAL NAND MEMORY DEVICE WITH SOURCE LINE COMPRISING METALLIC AND SEMICONDUCTOR LAYERS

CROSS-REFERENCE TO RELATED APPLICATION

This application is based upon and claims the benefit of priority from Japanese Patent Application No. 2017-173288, filed Sep. 8, 2017, the entire contents of which are incorporated herein by reference.

FIELD

Embodiments described herein relate generally to a memory device.

BACKGROUND

Memory devices having three-dimensionally arranged memory cells are being developed. For example, a NAND-type memory device includes a plurality of word lines stacked in layers on a substrate and a plurality of semiconductor channels penetrating the word lines in the stacking direction thereof. Memory cells are located where a word line intersects a semiconductor channel. By including a peripheral circuit (or an element thereof) for driving memory cells at a location between the word lines and the substrate, it may be possible to provide a reduction in overall chip size or increase memory storage capacity. In a memory device with such a configuration, a plate-like source line is located between the word lines and the circuit and is electrically connected to the plurality of semiconductor channels. To distribute the electric potential of the source line uniformly, desirably the source line is made from a low-resistance metal material. However, for example, warpage of a wafer may be caused by stress occurring in the source line containing a metal material.

DETAILED DESCRIPTION

Figure 1A:
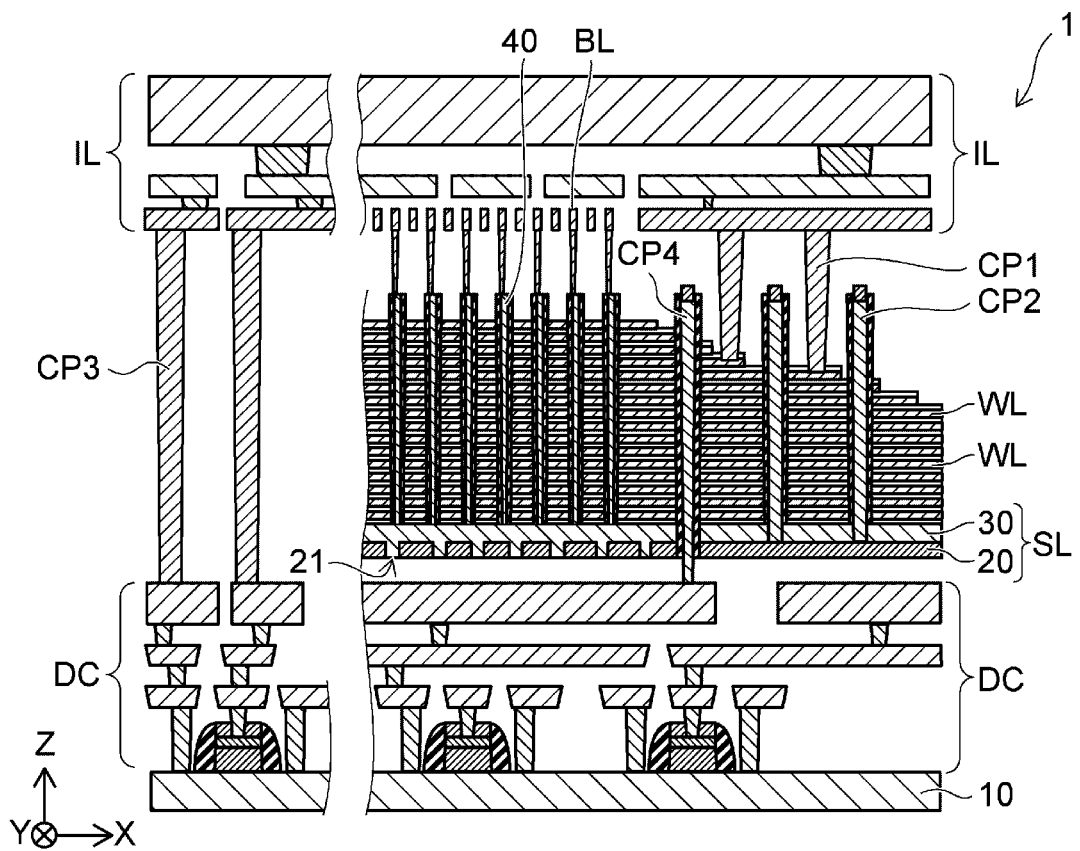
FIGS. 1A and 1B are schematic cross-sectional views each illustrating aspects of a memory device according to an embodiment.

An embodiment provides a memory device that is capable of restraining warpage of a wafer.

In general, according to an embodiment, a memory device includes a conductive layer comprising a metal, a semiconductor layer on the conductive layer, a plurality of electrode layers stacked on the semiconductor layer in a stacking direction, a semiconductor pillar penetrating the plurality of electrode layers in the stacking direction and electrically connected to the semiconductor layer, and a charge trap layer located between the electrode layers and the semiconductor pillar, wherein the conductive layer has a recess or a through-hole that is below the semiconductor pillar in the stacking direction.

Hereinafter, embodiments will be described with reference to the drawings. The respective same portions in the drawings are assigned the associated same reference numbers, and the detailed descriptions thereof are omitted as appropriate and only different portions are described. Furthermore, the drawings are merely schematic or conceptual. For example, the relationship between thickness and width of each portion and the ratio in size between respective portions are not necessarily the same as the actual ones. Moreover, even in a case where the same portion is illustrated, the respective dimensions or ratios thereof may be illustrated as differing from the drawings.

Furthermore, the location and configuration of each portion are described with use of an X-axis, a Y-axis, and a Z-axis illustrated in each figure. The X-axis, the Y-axis, and the Z-axis are perpendicular to each other, and represent an X-direction, a Y-direction, and a Z-direction, respectively. Moreover, the Z-direction may be referred to as upward and the opposite direction thereof may be referred to as downward for use in description.

Figure 1B:
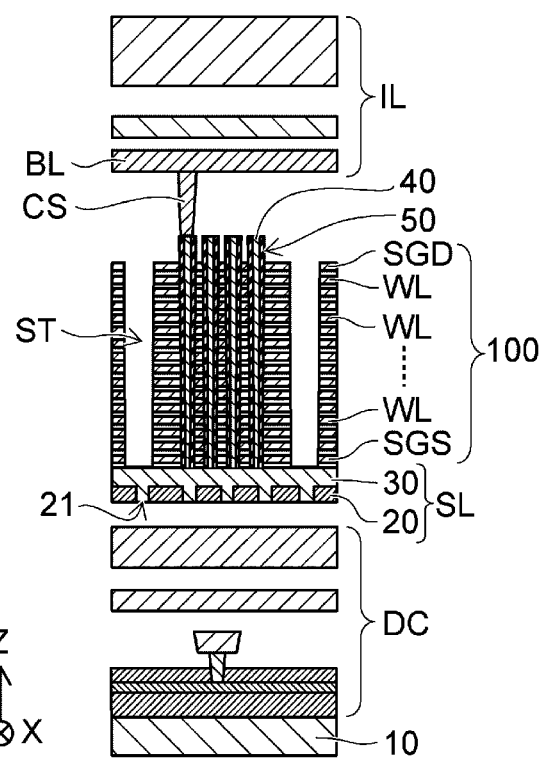

FIGS. 1A and 1B are schematic sectional views each illustrating a memory device 1 according to an embodiment. The memory device 1 is a NAND-type memory device and includes memory cells which are three-dimensionally arranged.

As illustrated in FIG. 1A, the memory device 1 includes a circuit DC provided on a substrate 10, a source line SL provided above the circuit DC, a plurality of word lines WL stacked in layers on the source line SL, and an interconnection layer IL provided above the word lines WL. FIG. 1A is a schematic diagram illustrating a cross-section parallel to the extending direction of the word lines WL, and, for convenience, omits insulating films provided between respective constituent elements.

The source line SL includes a conductive layer 20 and a semiconductor layer 30. The conductive layer 20 is formed from a low-resistance material containing a metal element, such as tungsten (W). The conductive layer 20 is, for example, a plate-like metal layer extending in both the X-direction and Y-direction. The semiconductor layer 30 is, for example, a polysilicon layer.

The word lines WL are stacked in layers on the source line SL via respective interlayer insulating films (not specifically illustrated). The word lines WL each extend in the X-direction, and the respective end portions thereof are formed in a staircase shape. Each of the word lines WL is, for example, a metal layer containing, for example, tungsten.

The memory device 1 further comprises a columnar semiconductor layer, which is hereinafter referred to as a "semiconductor pillar 40," penetrating the word lines WL and extending in the stacking direction thereof (Z-direction). The semiconductor pillar 40 contains, for example, silicon, and the lower end thereof is connected to the semiconductor layer 30 of the source line SL. Moreover, the conductive layer 20 of the source line SL comprises a stress relaxation portion 21 located below the semiconductor pillar 40. For example, the stress relaxation portion 21 comprises a recess or a through-hole formed in the conductive layer 20.

The interconnection layer IL is provided above the word lines WL, and includes a bit line BL which is electrically connected to the semiconductor pillar 40. Moreover, the interconnection layer IL includes interconnections electrically connected to the respective end portions of the word lines WL via contact plugs CP1. Furthermore, the interconnection layer IL includes interconnections (not illustrated) electrically connected to the source line SL via contact plugs CP2 penetrating the word lines WL and extending in the Z-direction. Moreover, the interconnection layer IL includes interconnections electrically connected to the circuit DC via contact plugs CP3. Thus, the source line SL and the word lines WL are electrically connected to the circuit DC via the interconnection layer IL.

Moreover, the memory device 1 may further include a contact plug CP4 penetrating the word lines WL and the source line SL and extending in the Z-direction. The contact plug CP4 electrically connects, for example, the interconnection layer IL to the circuit DC. The conductive layer 20 and the semiconductor layer 30 have through-holes through which the contact plug CP4 passes.

FIG. 1B is a schematic diagram illustrating a cross-section perpendicular to the word lines WL. As illustrated in FIG. 1B, a stacked body 100, which includes the word lines WL, is provided on the source line SL. The stacked body 100 further includes selection gates SGS and SGD. The selection gate SGS is located between the source line SL and the word lines WL. The selection gate SGD is located between the word lines WL and the interconnection layer IL. The stacked body 100 is segmented into a plurality of portions by slits ST. The slits ST extend in the X-direction and define the shapes of the word lines WL and the selection gates SGS and SGD. The inside of each of the slits ST is filled with, for example, an insulating layer (not specifically illustrated).

The semiconductor pillar 40 penetrates the selection gate SGS, the word lines WL, and the selection gate SGD to extend in the Z-direction. The memory device 1 further includes an insulating layer 50 located between each of the selection gate SGS, the word lines WL, and the selection gate SGD and the semiconductor pillar 40. The insulating layer 50 surrounds the side surface of the semiconductor pillar 40 and extends in the Z-direction.

The insulating layer 50 has a structure in which, for example, a plurality of insulating films is stacked in layers in a direction leading away from the semiconductor pillar 40 towards the word line WL. Insulating layer 50 functions as a charge trap layer at a portion located between the semiconductor pillar 40 and each of the word lines WL. A charge trap layer acts to retain a charge supplied thereto under certain conditions. Thus, the memory device 1 includes memory cells each provided at a portion at which the semiconductor pillar 40 intersects with the word line WL. Moreover, selection transistors are provided at respective portions at which the semiconductor pillar 40 intersects with the selection gates SGS and SGD.

Figure 2A:
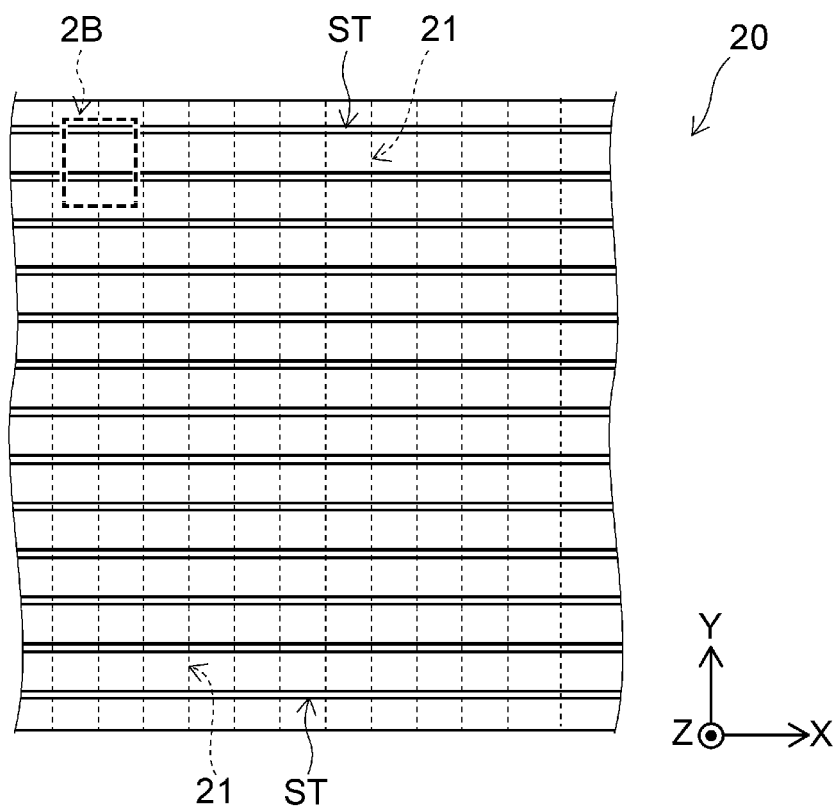
FIGS. 2A and 2B are schematic plan views each illustrating a conductive layer of the memory device according to an embodiment.
Figure 2B:
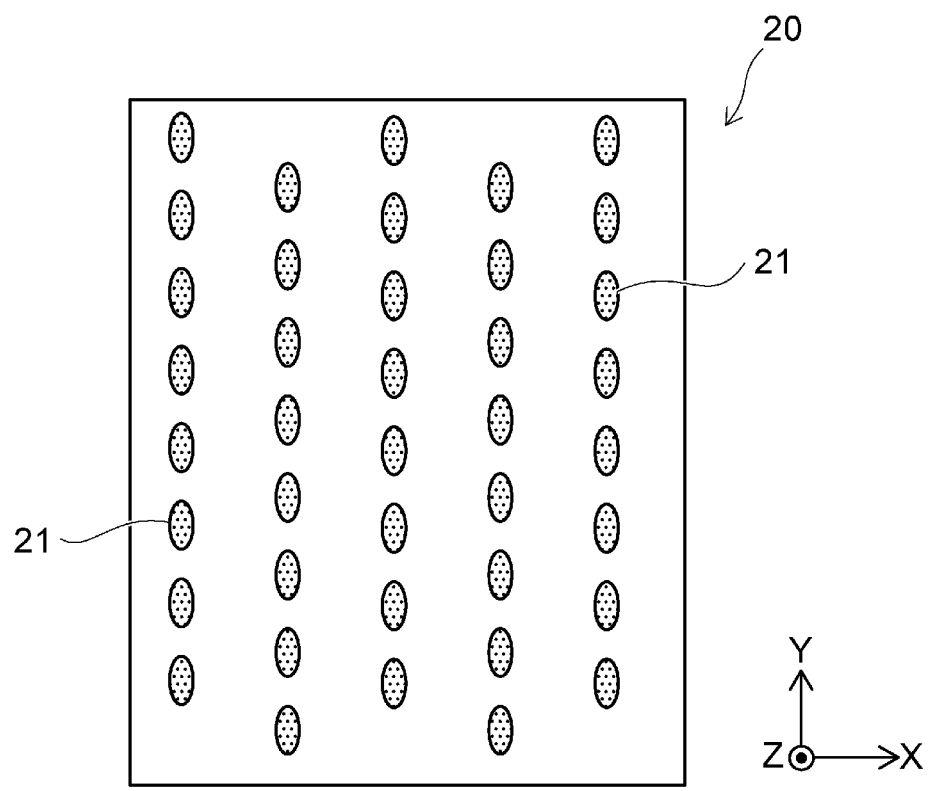

FIGS. 2A and 2B are schematic plan views each illustrating the conductive layer 20 of the memory device 1 according to an embodiment. FIG. 2B is a schematic diagram illustrating, in an enlarged manner, the region 2B illustrated in FIG. 2A.

As illustrated in FIG. 2A, the conductive layer 20 is provided in a plate shape extending in the X-direction and Y-direction. The slits ST extend in the X-direction and segment the stacked body 100 into a plurality of portions. The configuration of the conductive layer 20 is not limited to this example, and, for example, may instead be divided into a plurality of portions extending in the same direction as the extending direction of the slits ST.

If the conductive layer 20 is formed with a metal material, a thermal expansion difference between the conductive layer 20 and the interlayer insulating film, such as a silicon oxide film, or the word line WL may cause internal stress. However, the memory device 1 includes a plurality of stress relaxation portions 21 that are formed to reduce stress occurring in the conductive layer 20.

As illustrated in FIG. 2B, the stress relaxation portions 21 are arranged in such a way as to be located side by side in a direction intersecting with the extending direction of the slits ST, for example, in the Y-direction. The stress relaxation portion 21 is, for example, a through-hole TH (see FIG. 3A) or a recess RH (see FIG. 3B), which is obtained by removing a part of the conductive layer 20. Desirably the stress relaxation portions 21 are in a staggered arrangement in which the positions thereof in the Y-direction are shifted relative to each other with respect to rows thereof adjacent in the X-direction. Arranging the stress relaxation portions 21 in this way enables, for example, reducing stress caused by a thermal expansion difference between the conductive layer 20 and the word lines WL extending in the extending direction of the slits ST.

Figure 3A:
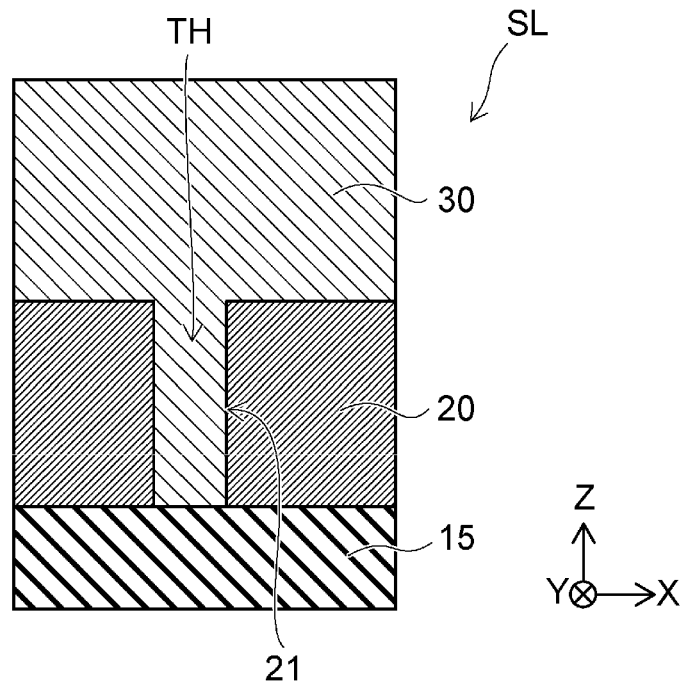
FIGS. 3A and 3B are schematic cross-sectional views each illustrating the conductive layer of the memory device according to an embodiment.
Figure 3B:
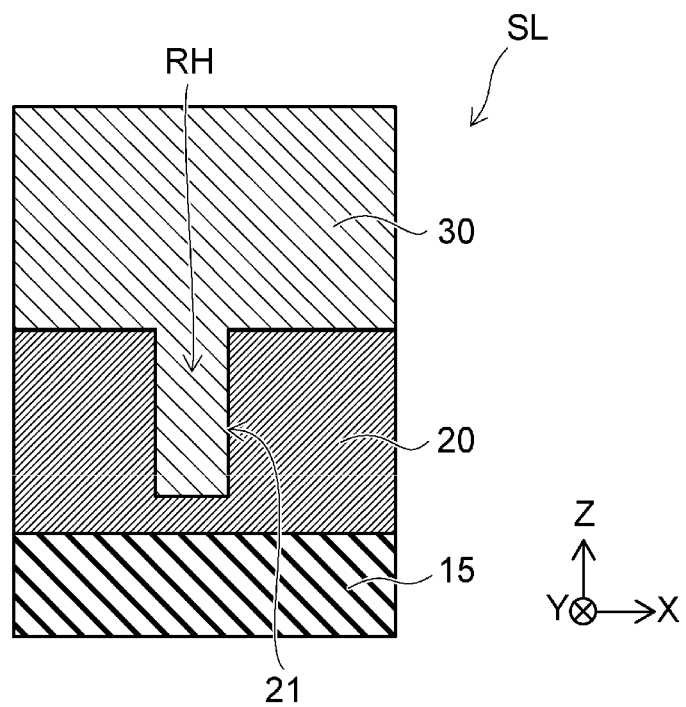

FIGS. 3A and 3B are schematic cross-sectional views each illustrating the source line SL. FIG. 3A illustrates a conductive layer 20 including a through-hole TH. FIG. 3B illustrates a conductive layer 20 including a recess RH.

The source line SL illustrated in FIG. 3A includes a conductive layer 20 and a semiconductor layer 30 which are stacked in layers on an interlayer insulating film 15. The conductive layer 20 includes, as the stress relaxation portion 21, a through-hole TH leading from the upper surface of the conductive layer 20 and communicating with the interlayer insulating film 15. The semiconductor layer 30 is provided on the conductive layer 20 in such a way as to fill the through-hole TH.

The conductive layer 20 is, for example, a metal layer containing tungsten, and is deposited on the interlayer insulating film 15 by using chemical vapor deposition (CVD). The through-hole TH is formed by selectively removing the conductive layer 20 using, for example, dry etching. The semiconductor layer 30 is, for example, a polysilicon layer deposited by using CVD.

In the source line SL illustrated in FIG. 3B, the conductive layer 20 includes, as the stress relaxation portion 21, a recess RH provided in a direction leading from the upper surface of the conductive layer 20 toward the interlayer insulating film 15. The semiconductor layer 30 is provided on the conductive layer 20 in such a way as to fill the recess RH. The recess RH is formed by selectively removing the conductive layer 20 using, for example, dry etching. In this case, dry etching is stopped before the interlayer insulating film 15 becomes exposed.

Figure 4:
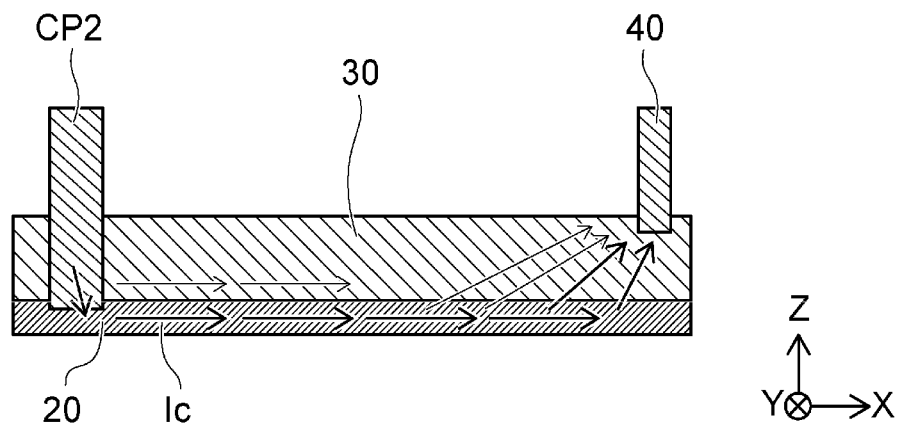
FIG. 4 is a schematic cross-sectional view illustrating characteristics of a memory device according to an embodiment.

FIG. 4 is a schematic cross-sectional view illustrating characteristics of the memory device 1 according to an embodiment. FIG. 4 illustrates the flow path of cell current Ic flowing from the contact plug CP2 to the semiconductor pillar 40. The lower end of the contact plug CP2 is connected to the conductive layer 20, and the lower end of the semiconductor pillar 40 is connected to the semiconductor layer 30. This enables reducing respective contact resistances.

While a part of the cell current Ic flowing from the contact plug CP2 flows inside the semiconductor layer 30, a majority thereof flows via the conductive layer 20. Then, in the vicinity of the semiconductor pillar 40, the majority of the cell current Ic crosses a boundary between the conductive layer 20 and the semiconductor layer 30 and flows toward the semiconductor pillar 40. Therefore, it is desirable to reduce the influence of an energy barrier at a boundary surface between the conductive layer 20 and the semiconductor layer 30 on the source line SL. In an embodiment, a part of the semiconductor layer 30 is provided inside the through-hole TH or the recess RH (see FIGS. 3A and 3B) provided in the conductive layer 20. This increases a contact area between the conductive layer 20 and the semiconductor layer 30. This enables reduced resistance of the source line SL to the cell current Ic.

Figure 5:
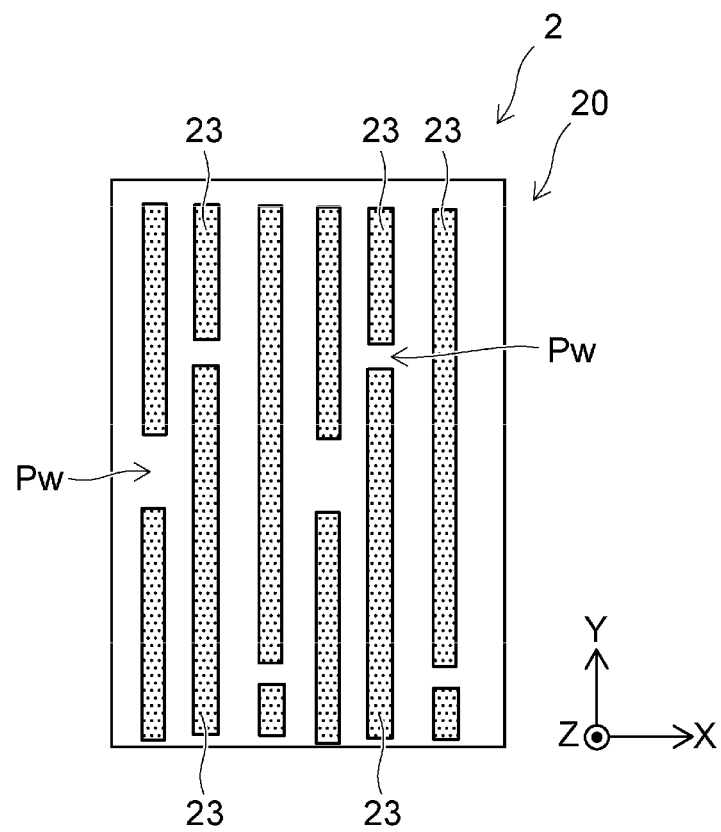
FIG. 5 is a schematic plan view illustrating a conductive layer of a memory device according to an embodiment.

FIG. 5 is a schematic plan view of a conductive layer 20 of a memory device 2 according to a modification example of an embodiment. In this example, the conductive layer 20 includes a plurality of stress relaxation portions 23. The stress relaxation portions 23 extend in a direction intersecting with the extending direction of the slit ST, for example, in the Y-direction. Moreover, the plurality of stress relaxation portions 23 is arranged side by side in the Y-direction. The stress relaxation portion 23 is, for example, a groove-shaped through-hole TH or recess RH. Furthermore, it is desirable that the stress relaxation portions 23 be arranged in such a manner that a portion Pw between stress relaxation portions 23 arranged side by side in the Y-direction overlaps a stress relaxation portion 23 adjacent as viewed in the X-direction. This enables reducing, for example, stress caused by a thermal expansion difference between the conductive layer 20 and the word line WL extending in the extending direction of the slit ST.

Figure 6A:
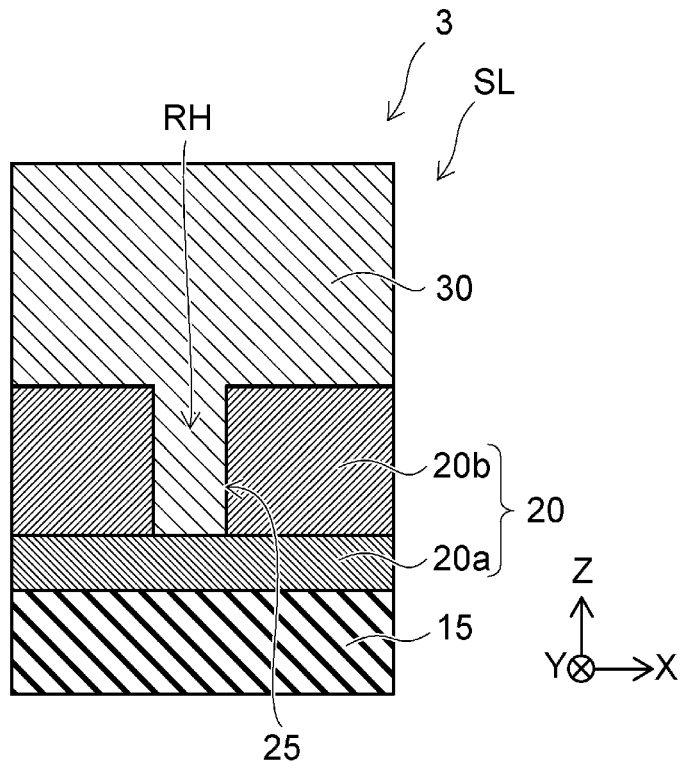
FIGS. 6A and 6B are schematic cross-sectional views respectively illustrating conductive layers of memory devices according to embodiments.
Figure 6B:
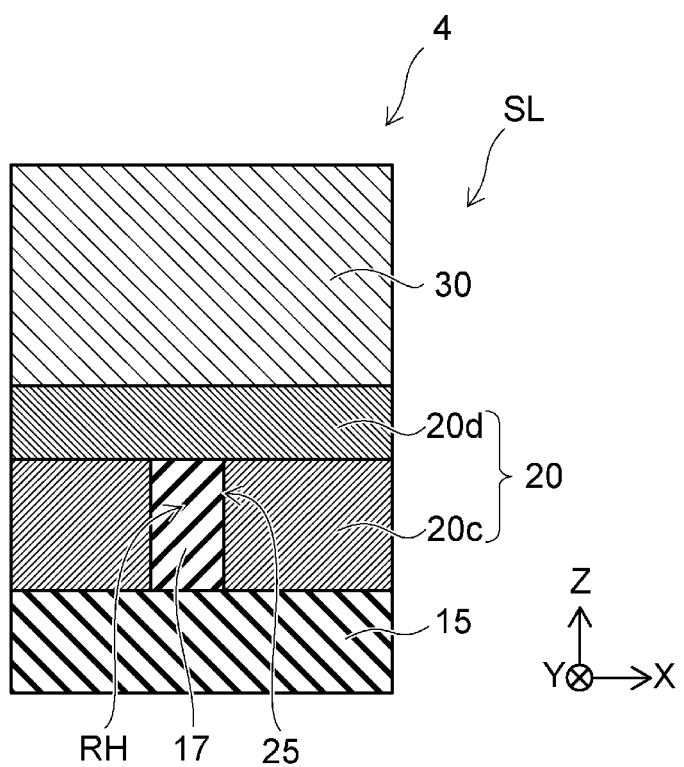

FIGS. 6A and 6B are schematic cross-sectional views respectively illustrating source lines SL of memory devices 3 and 4 according to modification examples of an embodiment. In each of the examples illustrated in FIGS. 6A and 6B, the conductive layer 20 includes a recess RH as a stress relaxation portion 25.

In the memory device 3 illustrated in FIG. 6A, the conductive layer 20 of the source line SL includes a first layer 20a provided on the interlayer insulating film 15 and a second layer 20b provided on the first layer 20a. The recess RH is provided in such a way as to lead from the upper surface of the second layer 20b and communicate with the first layer 20a. The first layer 20a and the second layer 20b contain respective different metal elements. The semiconductor layer 30 has a portion filling the recess RH.

For example, the first layer 20a and the second layer 20b are sequentially stacked on the interlayer insulating film 15. Subsequently, the recess RH is formed. In this example, the recess RH is formed by selectively removing the second layer 20b under etching conditions in which the first layer 20a functions as an etching stop layer. This facilitates forming a recess RH that does not communicate with the interlayer insulating film 15.

In the memory device 4 illustrated in FIG. 6B, the conductive layer 20 of the source line SL includes a first layer 20c provided on the interlayer insulating film 15 and a second layer 20d provided on the first layer 20c. The recess RH is provided in the first layer 20c. The inside of the recess RH is filled with, for example, an insulator 17.

In this example, first layer 20c is formed on the interlayer insulating film 15, and, after that, the recess RH leading from the upper surface of the first layer 20c and communicating with the interlayer insulating film 15 is formed. Subsequently, after the inside of the recess RH is filled with the insulator 17, the second layer 20d is formed. The insulator 17 includes, for example, silicon oxide. Moreover, the first layer 20c may contain a metal different from that of the second layer 20d, or may contain the same metal as that of the second layer 20d.

As described above, in the memory devices according to the present embodiment, providing a stress relaxation portion in the conductive layer 20 containing a metal enables a reduction in stress otherwise induced in a manufacturing process thereof, thus reducing wafer warpage. Moreover, filling the inside of a through-hole or a recess used as a stress relaxation portion 21 with a part of the semiconductor layer 30 enlarges a contact area between the conductive layer 20 and the semiconductor layer 30, which serves to reduce the resistance of the source line SL in the conductance of the cell current Ic.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device, comprising:
a conductive layer comprising a metal;
a semiconductor layer on the conductive layer;
a plurality of electrode layers stacked on the semiconductor layer in a stacking direction;
a semiconductor pillar penetrating the plurality of electrode layers in the stacking direction and electrically connected to the semiconductor layer; and
a charge trap layer located between the electrode layers and the semiconductor pillar, wherein
the conductive layer has a recess or a through-hole that is directly below the semiconductor pillar in the stacking direction.

2. The memory device according to claim 1, wherein the semiconductor layer includes a portion inside the recess or the through-hole.

3. The memory device according to claim 1, wherein
the plurality of electrode layers extend in a first direction parallel to an upper surface of the semiconductor layer, and
the recess or the through-hole extends in a second direction intersecting with the first direction.

4. The memory device according to claim 1, further comprising:
a peripheral circuit element on a substrate under the conductive layer in the stacking direction, the conductive layer being between the plurality of electrode layers and the peripheral circuit element.

5. A memory device, comprising:
a conductive layer comprising a metal;
a semiconductor layer on the conductive layer;
a plurality of electrode layers stacked on the semiconductor layer in a stacking direction;
a semiconductor pillar penetrating the plurality of electrode layers in the stacking direction and electrically connected to the semiconductor layer; and
a charge trap layer located between the electrode layers and the semiconductor pillar, wherein
the conductive layer has a recess or a through-hole that is below the semiconductor pillar in the stacking direction, and the semiconductor layer includes a portion inside the recess or the through-hole.

6. The memory device according to claim 5, wherein
the plurality of electrode layers extend in a first direction parallel to an upper surface of the semiconductor layer, and
the recess or the through-hole extends in a second direction intersecting with the first direction.

7. The memory device according to claim 5, further comprising:
a peripheral circuit element on a substrate under the conductive layer in the stacking direction, the conductive layer being between the plurality of electrode layers and the peripheral circuit element.

8. The memory device according to claim 5, wherein
the plurality of electrode layers extend in a first direction parallel to an upper surface of the semiconductor layer, and the conductive layer has a plurality of recesses, and
the plurality of recesses is arranged in a second direction intersecting with the first direction.

9. The memory device according to claim 5, wherein
the plurality of electrode layers extend in a first direction parallel to an upper surface of the semiconductor layer,
the conductive layer has a plurality of through-holes, and
the plurality of through-holes is arranged in a second direction intersecting with the first direction.

10. The memory device according to claim 5, wherein the conductive layer has the through-hole below the semiconductor pillar in the stacking direction.

11. The memory device according to claim 5, wherein the conductive layer has the recess below the semiconductor pillar in the stacking direction.

12. The memory device according to claim 5, wherein the recess or the through-hole is a groove.

13. The memory device according to claim 5, further comprising:
an insulating film, the conductive layer being between the insulating film and the plurality of electrode layers, wherein
the conductive layer comprises a first layer of first material on a first side of the conductive layer facing the plurality of electrode layers and a second layer of a second material on a second side of the conductive layer facing the insulating film, and
the through-hole or recess is in the second layer.

14. The memory device according to claim 13, wherein the first material is different from the second material.

15. The memory device according to claim 5, further comprising:
an insulating film, the conductive layer being between the insulating film and the plurality of electrode layers, wherein
the conductive layer comprises a first layer of first material on a first side of the conductive layer facing the plurality of electrode layers and a second layer of a second material on a second side of the conductive layer facing the insulating film, and
the through-hole or recess is in the first layer.

16. The memory device according to claim 15, wherein the first material is different from the second material.

* * * * *